US008148221B2

(12) United States Patent
Lim et al.

(10) Patent No.: US 8,148,221 B2
(45) Date of Patent: Apr. 3, 2012

(54) DOUBLE ANNEAL WITH IMPROVED RELIABILITY FOR DUAL CONTACT ETCH STOP LINER SCHEME

(75) Inventors: Khee Yong Lim, Singapore (SG); Victor Chan, Newburgh, NY (US); Eng Hua Lim, Singapore (SG); Wenhe Lin, Singapore (SG); Jamin F. Fen, Wappingers Falls, NY (US)

(73) Assignees: International Business Machines Corporation; GLOBALFOUNDRIES Singapore Pte. Ltd., Singapore (SG)

( * ) Notice: Subject to any disclaimer, the term of this patent is extended or adjusted under 35 U.S.C. 154(b) by 1 day.

(21) Appl. No.: 12/581,207

(22) Filed: Oct. 19, 2009

(65) Prior Publication Data

US 2010/0041242 A1 Feb. 18, 2010

Related U.S. Application Data

(63) Continuation of application No. 11/304,455, filed on Dec. 15, 2005, now Pat. No. 7,615,433.

(51) Int. Cl.
*H01L 21/336* (2006.01)
*H01L 21/8234* (2006.01)

(52) U.S. Cl. ................. 438/199; 257/369; 257/E21.633

(58) Field of Classification Search .................. 438/199; 257/E21.633
See application file for complete search history.

(56) References Cited

U.S. PATENT DOCUMENTS

| 5,777,370 | A | 7/1998 | Omid-Zohoor et al. |
| 5,872,387 | A | 2/1999 | Lyding et al. |
| 6,017,806 | A * | 1/2000 | Harvey .................. 438/475 |
| 6,436,799 | B1 | 8/2002 | Ramkumar et al. |
| 6,573,172 | B1 | 6/2003 | En et al. |
| 6,888,204 | B1 | 5/2005 | Lyding et al. |
| 6,953,728 | B2 | 10/2005 | Murakami et al. |
| 7,151,059 | B2 * | 12/2006 | Chaudhry et al. ............ 438/770 |
| 2002/0031920 | A1 | 3/2002 | Lyding et al. |
| 2002/0115251 | A1 * | 8/2002 | Takehiro ..................... 438/240 |
| 2002/0177290 | A1 * | 11/2002 | Ramkumar et al. ......... 438/530 |
| 2003/0181005 | A1 | 9/2003 | Hachimine et al. |
| 2004/0235236 | A1 | 11/2004 | Hoffmann et al. |
| 2006/0094259 | A1 * | 5/2006 | Gilmer et al. ................. 438/785 |

OTHER PUBLICATIONS

Lee et al. "The Effect of Deuterium Passivation at Different Steps of CMOS Processing on Lifetime Improvements of CMOS Transistors", Aug. 1999, IEEE Transactions on Electron Devices, vol. 46, No. 8, pp. 1812-1813.*

* cited by examiner

*Primary Examiner* — Matthew Landau
*Assistant Examiner* — Sonya McCall Shepard
(74) *Attorney, Agent, or Firm* — Horizon IP Pte Ltd

(57) ABSTRACT

A method for forming a device with both PFET and NFET transistors using a PFET compressive etch stop liner and a NFET tensile etch stop liner and two anneals in a deuterium containing atmosphere. The method comprises: providing a NFET transistor in a NFET region and a PFET transistor in a PFET region. We form a NFET tensile contact etch-stop liner over the NFET region. Then we perform a first deuterium anneal. We form a PFET compressive etch stop liner over the PFET region. We form a (ILD) dielectric layer with contact openings over the substrate. We perform a second deuterium anneal. The temperature of the second deuterium anneal is less than the temperature of the first deuterium anneal.

34 Claims, 8 Drawing Sheets

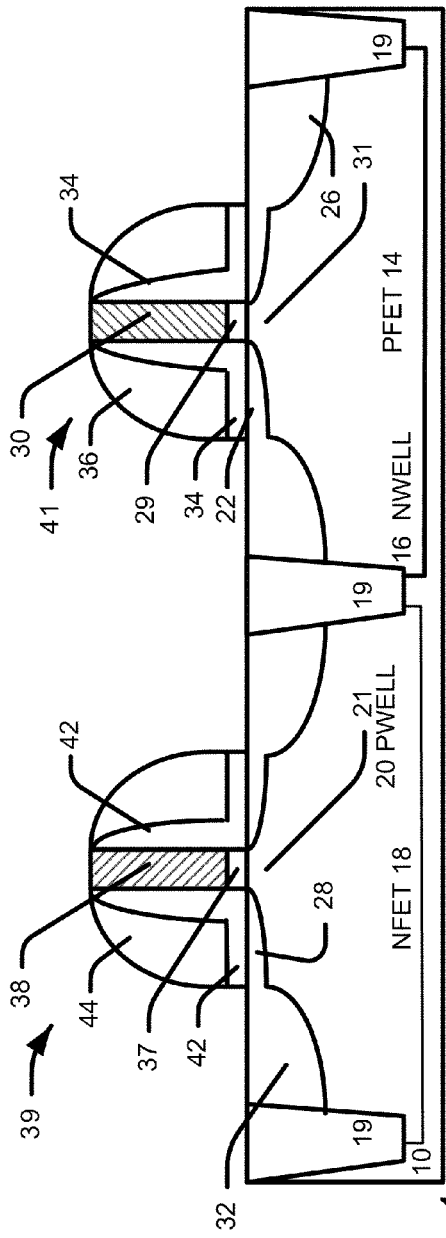
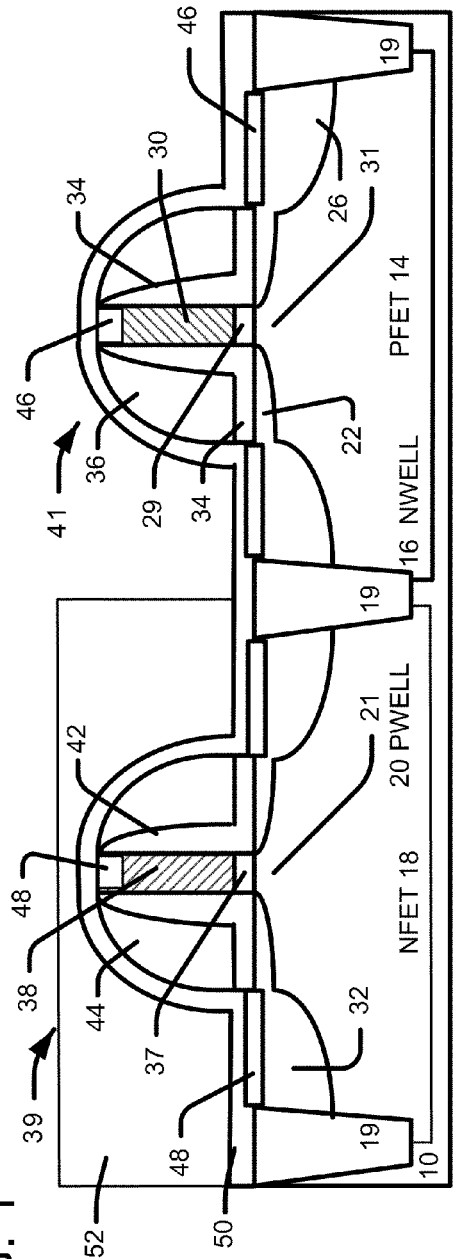
FIG. 1
FIG. 2

DOUBLE ANNEAL WITH IMPROVED RELIABILITY FOR DUAL CONTACT ETCH STOP LINER SCHEME

CROSS REFERENCES TO RELATED APPLICATIONS

This application is a Continuation application which claims benefit of co-pending U.S. patent application Ser. No. 11/304,455 filed Dec. 15, 2005. This application is hereby incorporated by reference in its entireties.

BACKGROUND OF INVENTION

1) Field of the Invention

This invention relates generally to fabrication of semiconductor devices and more particularly to a method for an deuterium containing anneal for a semiconductor device.

2) Description of the Prior Art

Dangling bonds at the silicon/silicon oxide interface in semiconductor devices are believed to be the cause of observed non-ideal capacitance-voltage characteristics and reduced channel conductance. Low temperature post-metallization annealing in a hydrogen-containing atmosphere is typically used in the semiconductor device fabrication process, to passivate these dangling bonds. During operation, however, transistor performance can degrade, and this degradation has been correlated to the removal of hydrogen from the silicon/silicon oxide interface, due to collisions between heated carriers and the interface. This degradation in hot carrier lifetime (also referred to as HCl lifetime) is exacerbated by the ever ongoing miniaturization of semiconductor devices, and has become a significant limitation in the further shrinkage of semiconductor devices.

A widely used method for minimizing the degradation of HCl lifetime has been to reduce the peak of the electric field in the transistor by appropriate selection of spacer dimensions, and the implantation of ions to form lightly doped regions between the channel and the corresponding source/drain regions of the transistor. Continued miniaturization is severely limiting the usefulness of these techniques.

Another method is to replace hydrogen with deuterium during annealing, taking advantage of the increased strength of the deuterium-silicon bond as compared with the hydrogen-silicon bond.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 6,436,799: Process for annealing semiconductors and/or integrated circuits—Semiconductor structure manufacturing method for semiconductor device, involves exposing portion of substrate through contact hole and annealing structure in deuterium containing atmosphere—Inventor: Ramkumar, Krishnaswamy; San U.S. Pat. No. 6,888,204: Semiconductor devices, and methods for same—Passivating semiconductor devices especially silicon MOSFETs—comprises treatment with deuterium so that device resilience to hot carrier effects is increased—Inventor: Lyding, Joseph W.; et al.

US20020031920A1: Deuterium treatment of semiconductor devices—CMOS transistor treatment involves annealing using deuterium whose partial pressure is higher than atmospheric pressure to form more concentration of deuterium at interface between semiconductor and insulating layer regions—Inventor: Lyding, Joseph W.;

U.S. Pat. No. 5,872,387: DEUTERIUM-TREATED SEMICONDUCTOR DEVICES—Passivating semiconductor devices especially silicon MOSFETs—comprises treatment with deuterium so that device resilience to hot carrier effects is increased—INVENTOR: LYDING, JOSEPH W.; CHAMPAIGN US20030181005A1: Semiconductor device and a method of manufacturing the same—Manufacture of semiconductor device involves forming over n-type and p-type field effect transistors, insulating films for generating tensile stress and compressive in stress channel formation region of the transistors—Inventor: Hachimine, Kiyota; Mitaka, Japan U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, et al.

US20040235236A1: Integrated circuit with improved channel stress properties and a method for making it—Integrated circuit comprises silicate glass layer formed only on p-type metal oxide semiconductor transistor or n-type metal oxide semiconductor transistor and etch stop layer formed on silicate glass layer—INVENTOR: HOFFMANN, THOMAS.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later.

An example embodiment of the present invention provides a structure and a method of manufacturing a semiconductor device using two deuterium containing anneals which is characterized as follows.

We provide a NFET transistor in a NFET region in a substrate; and provide a PFET transistor in a PFET region in the substrate. We form a NFET tensile contact etch-stop liner over the NFET region. We perform a first deuterium anneal of the substrate at a first temperature. We form a PFET compressive etch stop liner over the PFET region. We form a dielectric layer over the substrate. We form contact openings through the dielectric layer. We perform a second deuterium anneal of the substrate at a second temperature. The second temperature is lower than the first temperature.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 8 are cross sectional views for illustrating a method for manufacturing a semiconductor device using two anneals according to an example embodiment of the present invention.

DETAILED DESCRIPTION OF THE EXAMPLE EMBODIMENTS

A. Introduction

Figure 3:
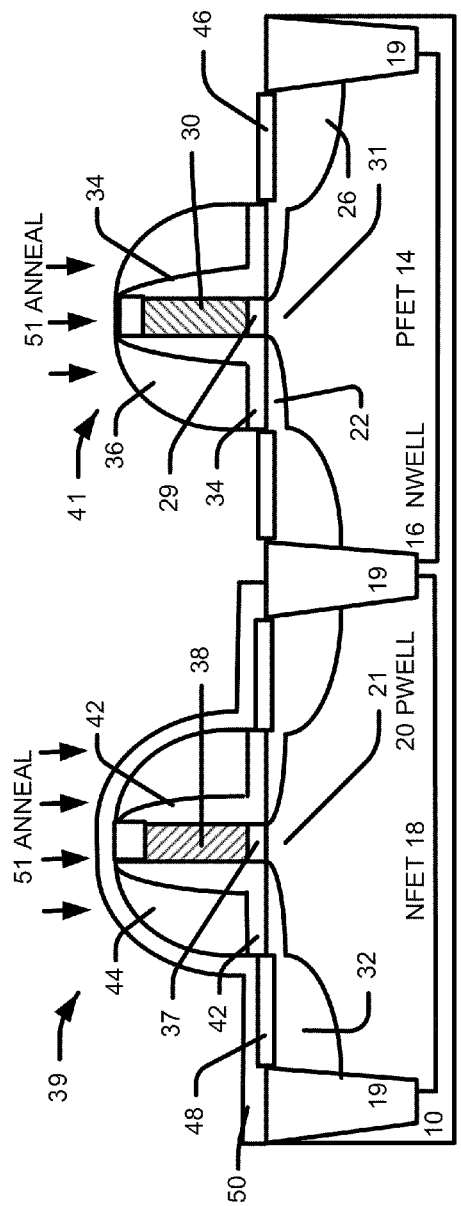

The example embodiments of the present invention will be described in detail with reference to the accompanying drawings. An example embodiment provides a method of forming a device with both PFET and NFET transistors using a PFET compressive etch stop liner and a NFET tensile etch stop liner.

The embodiment uses two anneals in a deuterium (D2) containing atmosphere to improve hot carrier reliability. In an example embodiment, the first D2 anneal is preferably first temperature (higher than the T of the second anneal) and can be performed after the first tensile contact etch-stop-liner has been etched. This first D2 anneal will anneal and repair the damage caused by prior process steps. Then a PFET compressive etch-stop liner is deposited over the PFET Tx. An interlayer dielectric (ILD) layer is formed over the substrate. Contact holes are etched through the ILD layer. A barrier metal layer is formed in the contact hole walls.

Then, a second (medium) temperature D2 anneal is performed at a second temperature. The second anneal repairs the damage that is caused by the plasma etch processes, such as the two etchings in the dual liner process, HDP deposition and the contact hole etch.

The first D2 anneal is formed before the compressive ESL is deposited on pFET region, it does not relax the (subsequently formed) PFET compressive stress liner and will not affect pFET performance. The second temperature is lower than the first temperature (of the 1$^{st}$ D2 anneal) preferably by at least 75 degrees C. The second D2 anneal temperature and time are carefully selected so that it will not degrade (core) pFET drive current by for example relaxing the PFET compressive stress liner. On the other hand, Si dangling bond which causes (thick) gate hot-carrier reliability problem have been passivated by these two D2 anneals.

A example embodiment of a method of fabrication of semiconductor device is described below.

B. Provide a NFET Transistor and a PFET Transistor

Referring to FIG. 1, we provide a NFET transistor 39 in a NFET region 18 in a substrate 10. We provide a PFET transistor 41 in a PFET region 14 in the substrate 10.

An example NFET transistor 39 can be comprised of a NFET source drain region 32, NFET shallow extension region 28, a NFET pocket region (not shown); NFET channel 21, a NFET gate dielectric 37; a NFET gate 38; and a gate spacer. The gate spacer can be comprised one or more spacers such as a NFET first (offset) spacer (not shown); a NFET second spacer (e.g., spacer liner) 42; and a NFET third spacer 44.

An example NFET gate dielectric thickness for regular devices or thin gate dielectric device (e.g., for core devices— not a thick I/O device) is preferably between 12 and 22 angstroms.

An example thick NFET gate dielectric transistor (for e.g., I/O devices), can have a gate dielectric thickness between 32 and 72 angstroms.

An example PFET transistor 41 can be comprised of a PFET source drain region 26, a PFET shallow extension region 22, a PFET pocket region (not shown); a PFET channel 31, a PFET gate dielectric 29; a PFET gate 30; and a gate spacer. The gate spacer can be comprised one or more spacers such as a PFET first offset spacer (not shown); a PFET second spacer (e.g., spacer liner) 34; and a PFET third spacer 36.

The PFET gate dielectric 29 thickness for a thin gate dielectric or regular device can be between 12 and 22 angstroms.

For a thick PFET gate dielectric device for a I/O devices, the gate dielectric thickness can be between 32 and 72 angstroms.

In an aspect, the thick I/O gate dielectric is at least 20 A thicker than the core thin gate dielectric.

We preferably provide isolation regions 19 separating the NFET region 18 and the PFET region 14.

C. Provide NFET Silicide Regions and PFET Silicide Regions

Referring to FIG. 2, we provide NFET silicide regions 48 over the NFET source drain regions 32 and NFET gate 38; and provide PFET silicide regions 46 over the PFET source drain regions 26 and PFET gate 30.

D. Form a NFET Tensile Contact Etch-Stop Liner Over the NFET Region

Referring to FIGS. 2 and 3, we form a NFET tensile contact etch-stop liner (ESL) 50 over the NFET region 18. The NFET tensile contact etch-stop liner (ESL) 50 preferably puts a tensile stress on the NFET transistor (e.g., channel) to increase device performance.

The NFET tensile contact etch-stop liner 50 can be formed by forming an etch stop liner (ESL) over the substrate surface (e.g., over the S/D regions, gate structure) Then we can form a NFET ESL mask 52 over the NFET region 18. Then we remove the etch stop liner not covered by the NFET ESL mask 52. Then the mask is removed.

The ESL can be comprised of nitride made by a CVD (chemical vapor deposition) process. The ESL can be consist essentially of nitride E. Perform a First Deuterium Containing Anneal Referring to FIG. 3, we perform a first deuterium (D2) anneal 51 at a temperature between about 500 and 600 degrees C. (tgt=550 C) for a time between 20 and 40 minutes to form an annealed.

The first D2 anneal is high temperature and is located after the first tensile contact etch-stop-liner has been etched. This will anneal and repair the damage to the gate dielectric layer caused by process steps prior to the first contact etch-stop-liner (ESL) etch. For example, damage is caused by the preceding etch step, such as the PC RIE (reactive-ion-etch), spacer etch, silicide block etch.

The structure shown in FIG. 3 may be annealed in a deuterium-containing atmosphere. A deuterium-containing atmosphere is a gas that contains deuterium in a higher concentration than would naturally be present based on the amount of hydrogen in the gas. This atmosphere preferably contains 10-20% deuterium, by volume. The remaining portion of the atmosphere is not limited, but preferably contains an inert gas, such as nitrogen, helium, neon, argon, krypton, xenon and mixtures thereof. Other possible gases include hydrogen (a small amount of which is commonly present in deuterium), and hydrocarbons or deuterated hydrocarbons such as methane and ethane.

The annealing temperature is preferably at least 375° C. The maximum temperature for annealing is limited by the tolerance of the structure being annealed to heating without being damaged. Preferably, the annealing temperature is between about 500 and 650° C.

The annealing time is chosen to allow diffusion of the deuterium into the substrate/gate dielectric interface, and will decrease as the temperature increases, the concentration of deuterium in the atmosphere increases, and/or the pressure increases. Preferably, the annealing time is for at least 10 minutes to 1 hour.

Form a PFET Compressive Etch Stop Liner

Figure 4:
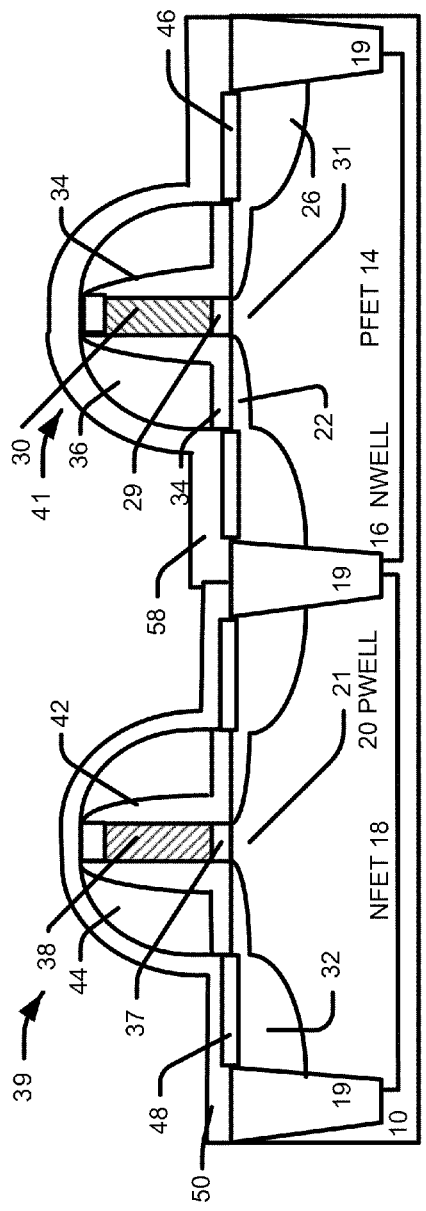

Referring to FIG. 4, we form a PFET compressive etch stop liner 58 over the PFET region 14.

The PFET compressive etch stop liner 58 puts a compressive stress on the PFET transistor (e.g., channel).

The PFET compressive etch stop liner 58 can be formed by 1) forming a ESL layer over the substrate, 2) masking to cover the PFET region and 3) etching to remove the unmasked region; and 4) removing the mask.

F. Form a Dielectric Layer

Figure 5:
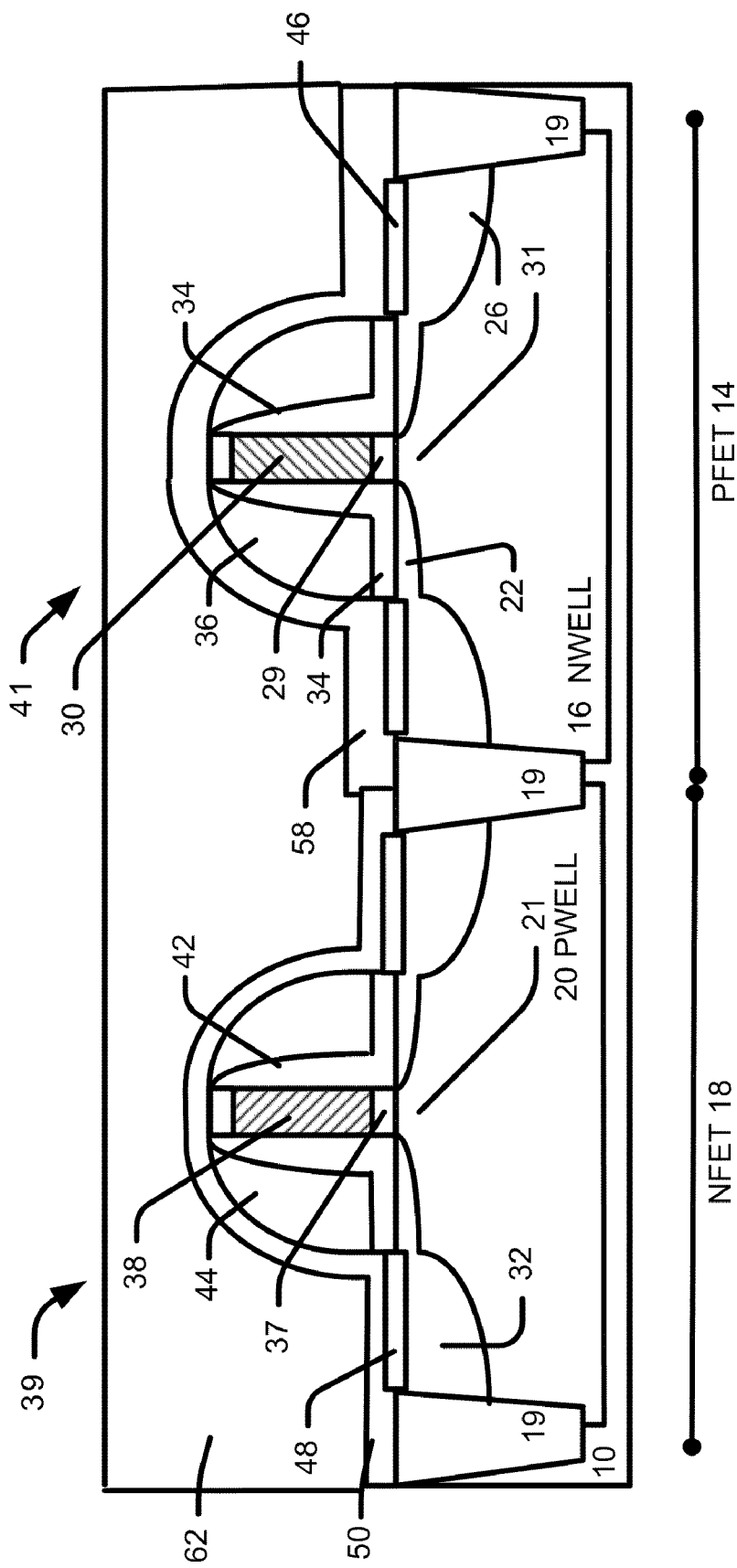

As shown in FIG. 5, we form a (ILD) dielectric layer 62 over the substrate 10. The dielectric layer is preferably a HDP CVD oxide layer preferably having a thickness between 5500 and 7500 angstroms.

Form a Contact Mask

Figure 6:
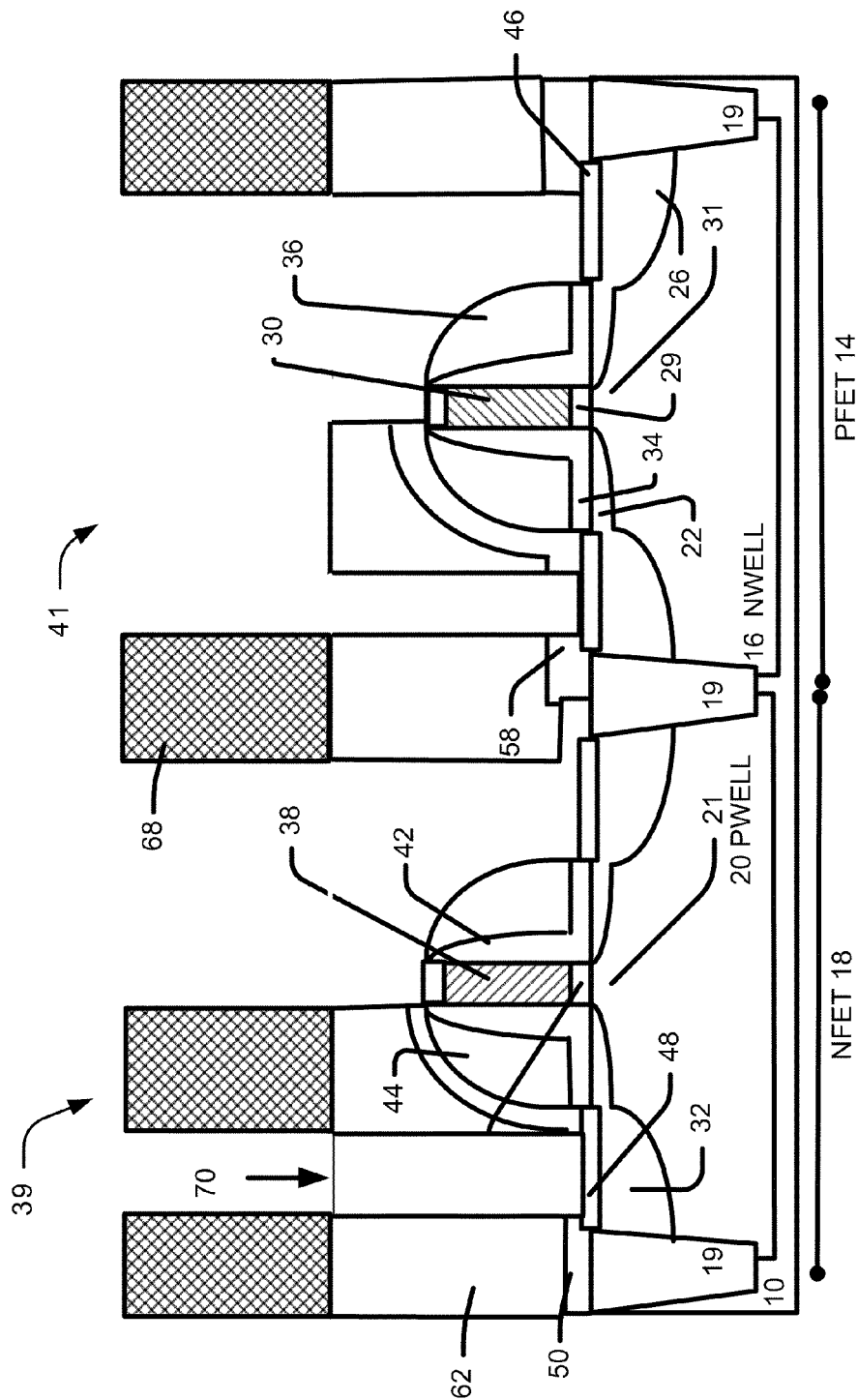

Referring to FIG. 6, we form a contact mask 68 having contact mask openings over the dielectric layer 62.

G. Form Contact Openings in the Dielectric Layer

We form contact openings 70 in the dielectric layer 62 using an etch process.

The contact mask 68 is then removed.

H. Form a Liner on the Sidewalls of the Dielectric Layer

Figure 7:
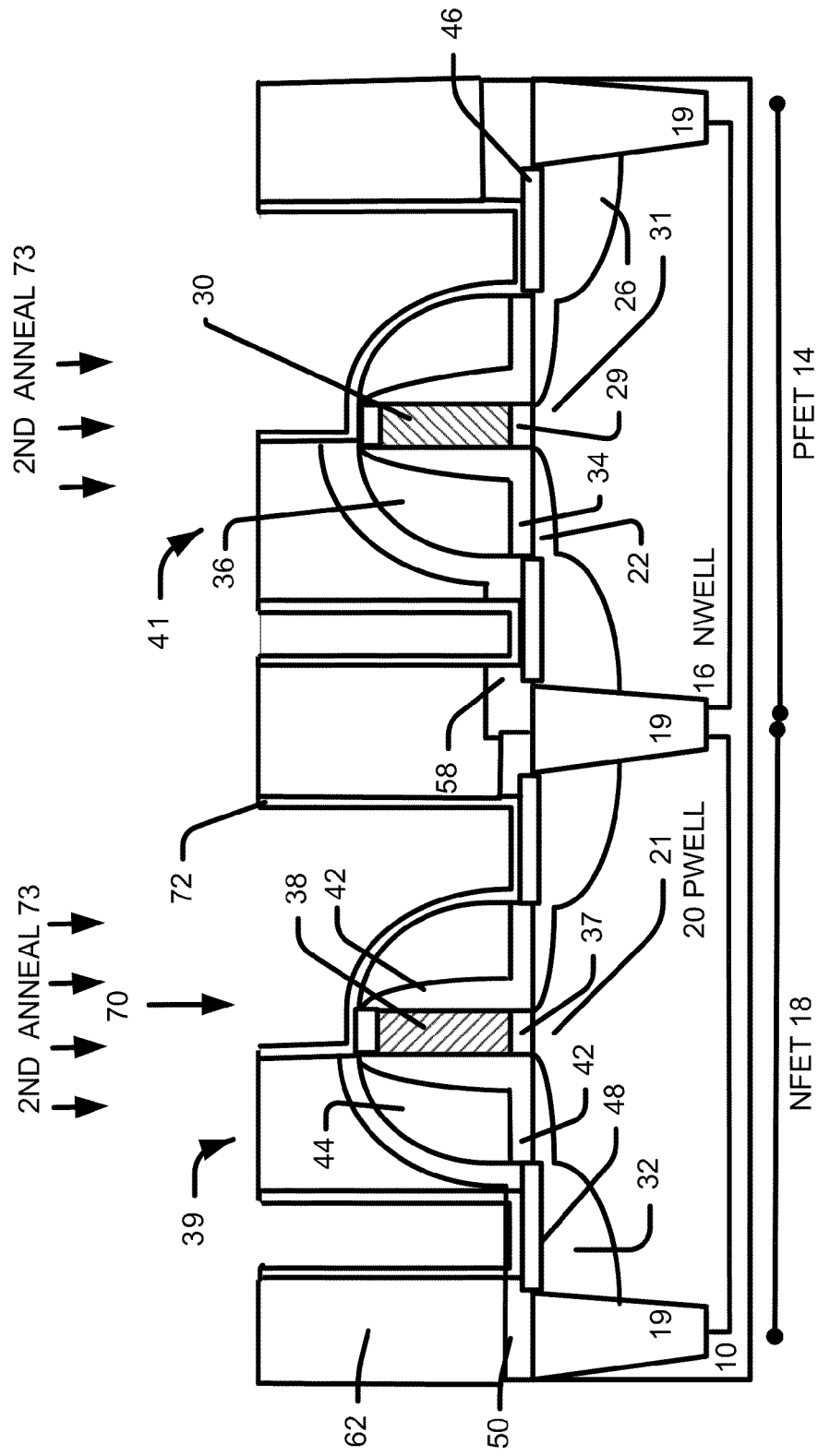

As shown in FIG. 7, we form a liner 72 on the sidewalls of the dielectric layer 62 and over the PFET and NFET silicide regions 46 48. The liner 72 is preferably comprised of a conductive metal such as Ti, TiN, TaN or combinations thereof.

I. Performing a Second Deuterium Anneal

As shown in FIG. 7, we perform a second deuterium anneal 73 at a temperature between 350 and 500 (tgt between 400 and 450 degree C.) for a time between 20 and 40 mins. The second deuterium anneal temperature is less than the first d2 anneal temperature by at least 75 degrees and more preferably at least 100 degrees.

The purpose of the second deuterium anneal is to repair damage on the gate dielectric caused by plasma process during dual contact etch stop liner process without relaxing stress in the liner formed.

The example structure shown in FIG. 7 may be annealed in a deuterium-containing atmosphere. A deuterium-containing atmosphere is a gas that contains deuterium in a higher concentration than would naturally be present based on the amount of hydrogen in the gas. This atmosphere preferably contains 10-20% deuterium, by volume. The remaining portion of the atmosphere is not limited, but preferably contains an inert gas, such as nitrogen, helium, neon, argon, krypton, xenon and mixtures thereof. Other possible gases include hydrogen (a small amount of which is commonly present in deuterium), and hydrocarbons or deuterated hydrocarbons such as methane and ethane.

The second annealing temperature is preferably at least 300° C. The maximum temperature for annealing is limited by the tolerance of the structure being annealed to heating without being damaged. Preferably, the annealing temperature is between about 350 and 500° C.

The annealing time is chosen to allow diffusion of the deuterium into the substrate/gate dielectric interface, and will decrease as the temperature increases, the concentration of deuterium in the atmosphere increases, and/or the pressure increases. Preferably, the annealing time is for at least 10 minutes to 1 hour.

The second D2 anneal can be performed anytime after the PFET compressive liner is formed.

J. Form Contact Plugs

Figure 8:
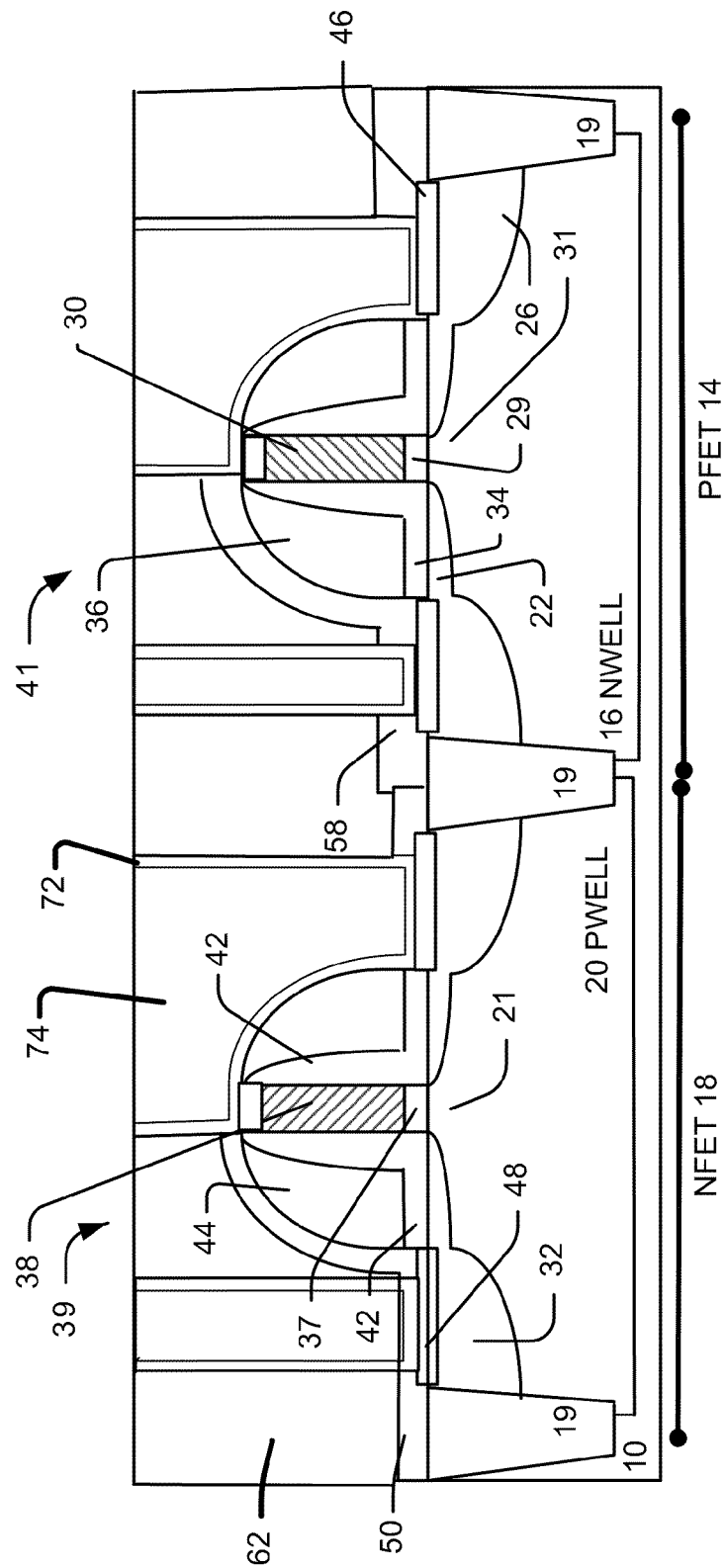

Referring to FIG. 8, we form contact plugs 74 filling the contact openings 70.

The contact plugs can be formed by 1) depositing a contact plug layer over substrate; and 2) chemical-mechanical polishing (CMP) the contact plug layer to form contact plugs 74 filling the contact openings 70.

The contact plugs can be comprised of Tungsten (W).

The device continues on with conventional processing to complete the device.

K. Example Devices

I/O

In an aspect of a embodiment, the NFET and PFET devices formed are thick gate I/O (input/output devices) and thin gate core device. The dual contact etch-stop nitride 50 58 was implemented so that tensile and compressive nitride film were deposited on the nFET 39 and pFET 41 respectively. The mechanical stress from the nitride films 50 58 can modulate the channel mobility and hence the drive current.

Both the high temperature D2 (deuterium gas) anneal 51 (FIG. 3) and medium temperature D2 anneal 73 (FIG. 7) can improve thick gate nFET hot-carrier reliability because it is thought to passivate Si-dangling bonds under gate oxide and Si channel interface. Also, the temperature of D2 anneal 73 (FIG. 7) has to be carefully selected so as not to relax the mechanical stress of contact etch-stop nitride liner sitting on top of thin gate pFET device, which in turn does not reduce pFET's mobility and its speed performance.

In an example embodiment, we have shown a technique to improve thick gate nFET hot-carrier reliability without degrading thin gate pFET mobility and drive current.

L. Supporting Data

Figure 9:
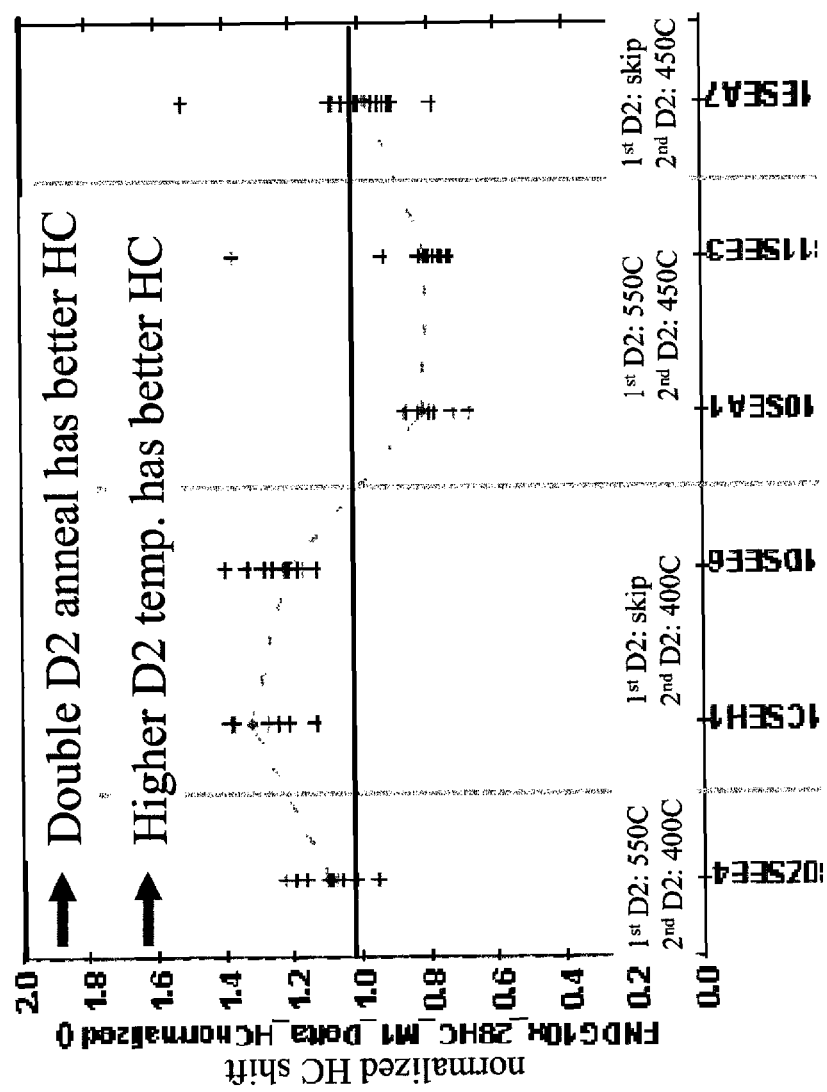
FIG. 9 shows a plot of Normalized Hot-Carrier Shift vs D2 anneal temperature and sequence according to an example embodiment of the present invention.

FIG. 9 shows a plot of Normalized Hot-Carrier Shift vs D2 anneal temperature and sequence.

The normalized hot-carrier shift is a gauge for determining hot-carrier reliability. For meeting the modeled HC spec, its value should be equal or smaller than unity. (The lower the better).

Figure 10:
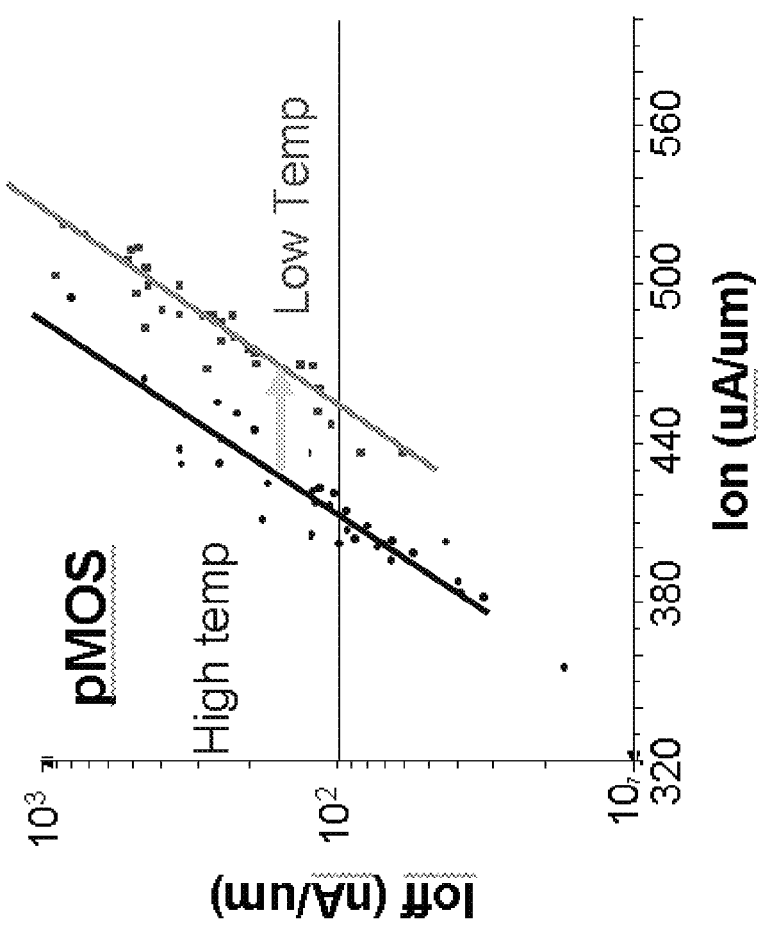
FIG. 10 shows a plot of PFET Performance vs D2 Anneal Temperature according to an example embodiment of the present invention.

FIG. 10 shows a plot of PFET Performance vs D2 Anneal Temperature. PFET Ion-Ioff plot is a gauge for PFET performance margin. PFET performance is better with higher Ion at the same Ioff (right line is better than left line). The plot shows that PFET performance is better with lower D2 anneal temperature. The low temperature is 400 degrees C. The high temperature is 550 degrees C. Low temp data points are the squares. High temp data points are the circles on the graph.

M. Non-Limiting Example Embodiments

An feature of this embodiment is to use two D2 anneals on dual contact etch-stop stressor liner process. The first D2 anneal is at high temperature than the second D2 anneal. The first D2 anneal can be preformed after the first tensile contact etch-stop-liner has been etched. This will anneal and repair the damage caused by prior process steps. Then a second layer of compressive etch-stop liner was deposited. Afterwards, a second medium temperature D2 anneal 73 can be performed after barrier metal liner 72 deposition. An advantage of doing the second anneal is that it repairs the damage that is caused by the plasma process.

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a device comprising:
providing a substrate prepared with a device feature in a device region;
annealing the substrate with a first anneal;
forming a device layer over the device region covering the device feature, wherein the device layer comprises a first stress for applying stress on the substrate; and
annealing the substrate with a second anneal at a temperature $T_2$ after forming the device layer, wherein $T_2$ is below a threshold temperature which causes relaxation of the first stress of the device layer to avoid or reduce relaxation of the stress applied on the substrate.

2. The method of claim 1 wherein the first anneal comprises a deuterium anneal.

3. The method of claim 1 wherein the first and second anneals comprise deuterium anneals.

4. The method of claim 1 wherein the first anneal comprises a temperature $T_1$ which is higher than the temperature of the second anneal $T_2$.

5. The method of claim 4 wherein $T_1$ is about 375-650° C.

6. A method of fabricating a device comprising:
providing a substrate prepared with a device region;
annealing the substrate with a first anneal at a first temperature $T_1$;
forming a device layer over the device region, wherein the device layer comprises a first stress for applying stress on the substrate; and
annealing the substrate with a second anneal at a second temperature $T_2$ after forming the device layer, wherein $T_2$ is less than $T_1$ and is below a threshold temperature which causes relaxation of the first stress in the device layer to avoid or reduce relaxation of the stress applied on the substrate.

7. The method of claim 6 wherein:
the device feature comprises a p-type transistor including a gate, and
source/drain regions adjacent to the gate; and
the first stress of the device layer comprises a compressive stress.

8. The method of claim 6 wherein:
the substrate is prepared with a second device region with a second device feature; and
further comprises
prior to the first anneal, forming a second device layer over the substrate covering the device region and device feature, and
patterning the second device layer, wherein patterning the second device layer leaves the second device layer covering the second device region and second device feature and removes the second device layer from the device region.

9. The method of claim 6 wherein the first device layer comprises an etch stop layer.

10. The method of claim 6 wherein the first anneal comprises a deuterium anneal.

11. The method of claim 6 wherein the second anneal comprises a deuterium anneal.

12. The method of claim 6 wherein the first and second anneals comprise deuterium anneals.

13. The method of claim 6 comprises:
forming a dielectric layer over the device layer prior to the second anneal;

forming a contact opening in the dielectric layer to access a contact region of the device feature; and performing the second anneal after forming the contact opening.

14. The method of claim 7 wherein:

the substrate is prepared with a second device region with a second device feature comprising a n-type transistor including a gate, and source/drain contact regions adjacent to the gate; and further comprises prior to the first anneal, forming a second device layer over the substrate covering the device region and device feature and second device region and second device feature, the second device layer having a second stress, wherein the second stress comprises a tensile stress, and patterning the second device layer, wherein patterning the second device layer leaves the second device layer covering the second device region and second device feature and removes the second device layer from the device region.

15. The method of claim 10 wherein $T_1$ is about 375-650° C.

16. The method of claim 10 wherein a second ambient of the second anneal comprises hydrogen, nitrogen, helium, neon, argon, krypton, xenon, other inert gases or a combination thereof.

17. The method of claim 10 wherein the deuterium anneal comprises an ambient having about 10-20% deuterium.

18. The method of claim 13 wherein the first anneal comprises a deuterium anneal.

19. The method of claim 18 wherein a second ambient of the second anneal comprises hydrogen, nitrogen, helium, neon, argon, krypton, xenon, other inert gases or a combination thereof.

20. A method of fabricating a device comprising:

providing a substrate prepared with a device region;

annealing the substrate with a first anneal at a first temperature $T_1$;

forming a device layer over the device region, wherein the device layer comprises a first stress for applying stress on the substrate; and annealing the substrate with a second anneal at a second temperature $T_2$ after forming the device layer, wherein $T_2$ is less than $T_1$ and is below a threshold temperature which causes relaxation of the first stress in the device layer to avoid or reduce relaxation of the stress applied on the substrate, wherein prior to the first anneal, forming a second device layer over the substrate covering the device region and device feature; and patterning the second device layer, wherein patterning the second device layer removes the second device layer from the device region.

21. A method of fabricating a device comprising:

providing a substrate prepared with a device region having a transistor;

annealing the substrate with a first anneal at a first temperature $T_1$;

forming a device layer over the device region covering the transistor after the first anneal, wherein the device layer comprises a first stress for applying stress on the substrate;

forming a dielectric layer over the device region and the device layer;

forming a contact in the dielectric layer to access at least one contact region of the transistor; and annealing the substrate with a second anneal at a second temperature $T_2$, wherein $T_2$ is less than $T_1$ and is below a threshold temperature which causes relaxation of the first stress in the device layer to avoid or reduce relaxation of the stress applied on the substrate.

22. The method of claim 21 wherein:

the transistor comprises a p-type transistor; and the first stress of the device layer comprises a compressive stress.

23. The method of claim 21 wherein the device layer comprises an etch stop layer.

24. The method of claim 21 wherein the first anneal comprises a deuterium anneal.

25. The method of claim 22 further comprises:

prior to the first anneal, forming a second device layer over the substrate covering the device region and transistor; and patterning the second device layer, wherein patterning the second device layer removes the second device layer from the device region.

26. The method of claim 24 wherein $T_1$ is about 375-650° C.

27. The method of claim 24 wherein a second ambient of the second anneal comprises hydrogen, nitrogen, helium, neon, argon, krypton, xenon, other inert gases or a combination thereof.

28. A method of fabricating a device comprising:

providing a substrate prepared with a device region having a transistor;

annealing the substrate with a first anneal;

forming a device layer over the device region covering the transistor, wherein the device layer comprises a first stress for applying stress on the substrate;

forming a dielectric layer over the device region and the device layer;

forming a contact in the dielectric layer to access at least one contact region of the transistor; and annealing the substrate with a second anneal at a temperature $T_2$ after forming the device layer, wherein $T_2$ is below a threshold temperature which causes relaxation of the first stress in the device layer to avoid or reduce relaxation of the stress applied on the substrate.

29. The method of claim 28 wherein:

the transistor comprises a p-type transistor; and the first stress of the device layer comprises a compressive stress.

30. The method of claim 28 wherein the first device layer comprises an etch stop layer.

31. The method of claim 28 wherein the first anneal comprises a deuterium anneal.

32. The method of claim 28 wherein the first anneal comprises a temperature T1 which is about 375-650° C.

33. The method of claim 28 wherein the first and second anneals comprise deuterium anneals.

34. The method of claim 28 wherein $T_2$ is less than a temperature $T_1$ of the first anneal.

* * * * *